United States Patent
Lin et al.

(10) Patent No.: US 7,615,778 B2
(45) Date of Patent: Nov. 10, 2009

(54) ORGANIC ELECTROLUMINESCENT DEVICE, PIXEL STRUCTURE, ARRAY AND DRIVING METHOD THEREOF

(75) Inventors: En-Chiang Lin, Kaohsiung (TW); Chi-Chih Liao, Taipei (TW)

(73) Assignee: RITDisplay Corporation, Hsinchu (TW)

( * ) Notice: Subject to any disclaimer, the term of this patent is extended or adjusted under 35 U.S.C. 154(b) by 394 days.

(21) Appl. No.: 11/164,778

(22) Filed: Dec. 6, 2005

(65) Prior Publication Data
US 2006/0197460 A1 Sep. 7, 2006

(30) Foreign Application Priority Data
Dec. 6, 2004 (TW) .............................. 93137589 A

(51) Int. Cl.
*H01L 29/08* (2006.01)
(52) U.S. Cl. .......................................... 257/40; 438/99
(58) Field of Classification Search ................. 257/40, 257/250, 278, 347, 350, 351, 66, 72, E51.007, 257/E51.01, E51.017, E51.024, E51.005; 438/99
See application file for complete search history.

(56) References Cited

U.S. PATENT DOCUMENTS

| | | | |
|---|---|---|---|
| 6,201,267 B1 | 3/2001 | Gupta et al. | 257/206 |
| 6,528,816 B1 * | 3/2003 | Jackson et al. | 257/40 |
| 6,853,083 B1 * | 2/2005 | Yamauchi et al. | 257/763 |
| 7,283,108 B2 * | 10/2007 | Kasai | 345/76 |
| 2004/0119399 A1 * | 6/2004 | Nagayama | 313/500 |
| 2005/0145839 A1 * | 7/2005 | Yamamoto et al. | 257/40 |

* cited by examiner

*Primary Examiner*—Wai-Sing Louie
*Assistant Examiner*—Bilkis Jahan
(74) *Attorney, Agent, or Firm*—WPAT, P.C.; Anthony King; Kay Yang

(57) ABSTRACT

An organic electroluminescent device includes a first organic thin film transistor, a second organic thin film transistor and at least an organic functional layer. The organic functional layer is disposed between the second organic thin film transistor and the first organic thin film transistor. By applying voltages in the first organic thin film transistor and the second organic thin film transistor at the same time, a voltage difference between the two transistors is produced to make electrons and electric holes move into the organic functional layer and re-combine therein for emitting light. The integration of the organic thin film transistor and the organic electroluminescent device can widen aperture ratio and increase process reliability.

19 Claims, 8 Drawing Sheets

ORGANIC ELECTROLUMINESCENT DEVICE, PIXEL STRUCTURE, ARRAY AND DRIVING METHOD THEREOF

CROSS-REFERENCE TO RELATED APPLICATION

This application claims the priority benefit of Taiwan application serial no. 93137589, filed on Dec. 6, 2004. All disclosure of the Taiwan application is incorporated herein by reference.

BACKGROUND OF THE INVENTION

1. Field of Invention

The present invention relates to a light-emitting device, and more particularly, to an organic electroluminescent (OEL) device and pixel structure, array and driving method thereof.

2. Description of Related Art

Along with the advancement of multimedia information communication technology, the importance of displays in providing human the access to computer interface has increasingly acknowledged. The flat panel display (FPD) has become the mainstream product in the market because of high-quality resolution, efficient space utilization, low power consumption, and the freedom of radiation exposure.

The so-called flat panel displays include liquid crystal displays (LCD), organic electroluminescent displays, and plasma display panels (PDP), etc. The organic electroluminescent displays are self-emitting and can be divided into two groups, small molecular OLEDs (SMOLEDs) and Polymer OLEDs (Poly-OLEDs), depending on the molecular weights of the organic electroluminescent materials. The organic electroluminescent displays have the advantages of wide viewing angle, low production cost, faster response and higher switching speed (above 100 times faster than that of liquid crystal displays), low power consumption, and widespread applications in current-driven portable machines, wide temperature latitudes, light weight, and design versatility such as: miniaturization and slimness, to meet the requirements for displays in the Multimedia Age. Therefore, the organic electroluminescent displays have a great potential for becoming the next-generation flat-panel display medium.

The organic electroluminescent displays may be classified into active organic electroluminescent displays and passive organic electroluminescent displays, depending on the driving method. Currently, the active organic electroluminescent displays are most widely used thin film transistors (TFT) as the actuators for driving the display devices. FIG. 1 is a circuit diagram illustrating part of a conventional active organic electroluminescent display. Referring to FIG. 1, in the conventional active organic electroluminescent display 100, in general, two thin film transistors T1, T2 and a capacitor C are disposed in each pixel to drive a pixel electrode 106 to allow the organic electroluminescent device (not shown herein) to emit light. The pixel electrode 106 (the anode of the organic electroluminescent device) is transparent electrode; therefore, the light emitted from the organic electroluminescent device can be transmitted through the pixel electrode 106 to outside of the display. The actual emission area of the pixel shown in FIG. 1 merely equals the area of the pixel electrode 106, and light can not transmit through the area outside of the pixel electrode 106 (the area disposed with thin film transistors T1, T2 and capacitor C). Therefore, the aperture ratio of the organic electroluminescent display 100 is limited by the sizes of the thin film transistors T1, T2 and capacitor C. For wider aperture ratio of the active organic electroluminescent display 100, an increase in the area of the pixel electrode 106 is necessary but the process reliability is lowered accordingly.

To solve the problem discussed above, a top emission active organic electroluminescent display is provided conventionally. FIG. 2 is a profile view illustrating part of a conventional top emission active organic electroluminescent display. Referring to FIG. 2, when the anode 206 (i.e. the pixel electrode) of the active organic electroluminescent display 200 is a common metal electrode, and the cathode 210 thereof is a transparent electrode, the light emitted from the organic functional layer 208 may be transmitted through the cathode 210 along the direction 212 shown in FIG. 2. Since the active organic electroluminescent display 200 emits light from the top, the aperture ratio of the organic electroluminescent display 200 is not subject to the size of the actuator 204.

However, there are uncertain factors in the process with possibly a decrease in process reliability when the organic electroluminescent devices are driven by thin film transistors.

SUMMARY OF THE INVENTION

Accordingly, the present invention is directed to provide an organic electroluminescent device and pixel structure, array, and driving method thereof with wider aperture ratio and better process reliability.

According to an aspect of the present invention, an organic electroluminescent device is provided, including a first organic thin film transistor (OTFT), a second organic thin film transistor, and at least one organic functional layer. The first organic thin film transistor has a first control terminal, a first input terminal, a first output terminal, and a first channel located between the first input terminal and the first output terminal. The second organic thin film transistor has a second control terminal, a second input terminal, a second output terminal, and a second channel located between the second input terminal and the second output terminal. The organic functional layer is disposed between the second organic thin film transistor and the first organic thin film transistor.

According to an aspect of the present invention, a pixel structure of the organic electroluminescent device is provided, including the organic electroluminescent device as described above, an actuator, and a charge storage device. The second control terminal of the second organic thin film transistor is connected to the first output terminal of the first organic thin film transistor, the first control terminal of the first organic thin film transistor is connected to the second control terminal of the second organic thin film transistor through the organic functional layer. The actuator has a third output terminal, a third input terminal, and a third control terminal. The third output terminal is connected to the first input terminal of the first organic thin film transistor. The charge storage device is connected to the first output terminal of the first organic thin film transistor and the second input terminal of the second organic thin film transistor.

According to an aspect of the present invention, a pixel array of the organic electroluminescent device is provided, including the pixel structure of the organic electroluminescent device as described above, a first scan line, a data line, and a second scan line. The first scan line is connected to the third control terminal of the actuator, the data line is connected to the third input terminal of the actuator, the second scan line is connected to the first control terminal of the first organic thin film transistor.

In an embodiment of the present invention, the actuator includes at least a thin film transistor, and the charge storage device includes at least a capacitor.

In an embodiment of the present invention, the organic functional layer is disposed between the first channel and the second channel. Additionally, in other embodiments, the organic functional layer is disposed between the first input terminal and the second input terminal, or the first output terminal and the second output terminal. The projection of the first channel is perpendicular to the projection of the second channel.

In an embodiment of the present invention, the first organic thin film transistor is a p-type organic thin film transistor, and the second organic thin film transistor is an n-type organic thin film transistor. In the meantime, the first input terminal is a source, the first output terminal is a drain, the second input terminal is a drain, and the second output terminal is a source.

In an embodiment of the present invention, the first organic thin film transistor is an n-type organic thin film transistor, and the second organic thin film transistor is a p-type organic thin film transistor. In the meantime, the first input terminal is a drain, the first output terminal is a source, the second input terminal is a source, and the second output terminal is a drain.

In an embodiment of the present invention, the first channel is disposed on the first control terminal and the second channel is disposed under the second control terminal.

In an embodiment of the present invention, the organic electroluminescent device further includes a first insulating layer disposed between the first control terminal and the first channel, and a second insulating layer disposed between the second control terminal and the second channel. The first insulating layer is disposed between the first input terminal and the first output terminal and the first channel is disposed on the first insulating layer. The second insulating layer is disposed between the second input terminal and the second output terminal, and the second channel is disposed under the second insulating layer.

In an embodiment of the present invention, the first input terminal and the first output terminal are disposed in the organic functional layer. The second input terminal and the second output terminal are disposed in the organic functional layer as well.

In an embodiment of the present invention, the material of the organic functional layer includes at least one of polymer organic material or small molecule organic material. The material of the first control terminal, the first input terminal, the first output terminal, the second control terminal, the second input terminal, and the second output terminal is conductive material or conductive metal oxide, wherein the conductive metal oxides include at least one of indium tin oxide (ITO), aluminum zinc oxide (AZO), indium zinc oxide (IZO), and cadmium stannic oxide (CdSnO). In addition, the conductive materials include at least one of aluminum/lithium fluoride, aluminum, calcium, magnesium, indium, tin, manganese, chromium, copper, silver, gold, and alloys thereof. Wherein the alloys containing magnesium are magnesium silver alloy, magnesium indium alloy, magnesium tin alloy, magnesium stibium alloy or magnesium tellurium alloy. The low work function conductive materials are suitable for drains and sources of n-type organic thin film transistors while the high work function conductive materials are suitable for drains and sources of p-type organic thin film transistors.

According to an aspect of the present invention, a driving method for the organic electroluminescent device is further provided for driving the pixel array of the organic electroluminescent device discussed above. According to the method, supplying two voltages to turn on the actuator and the first organic thin film transistor, respectively, and to keep the second organic thin film transistor in the off status, and then inputting a data signal for storing in the charge storage device. The next step is to turn off the actuator and change the voltage applied to the first organic thin film transistor for turning on the second organic thin film transistor to produce a voltage difference between the first organic thin film transistor and the second organic thin film transistor. Therefore, the organic electroluminescent device can be driven.

By integrating the organic electroluminescent device and the organic thin film transistors, the present invention may provide organic electroluminescent devices with wider aperture ratio and better the process reliability.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Using the gates of the organic thin film transistor as the top electrode and the bottom electrode of the organic electroluminescent device, the present invention widens the aperture ratio of the organic electroluminescent device. The present invention will be explained below with reference to exemplary embodiments thereof, it will be understood by those of ordinary skill in the art that these embodiments are not used for limiting the present invention and various changes in form and details may be made therein without departing from the spirit and scope of the present invention as defined by the following claims.

Figure 1:
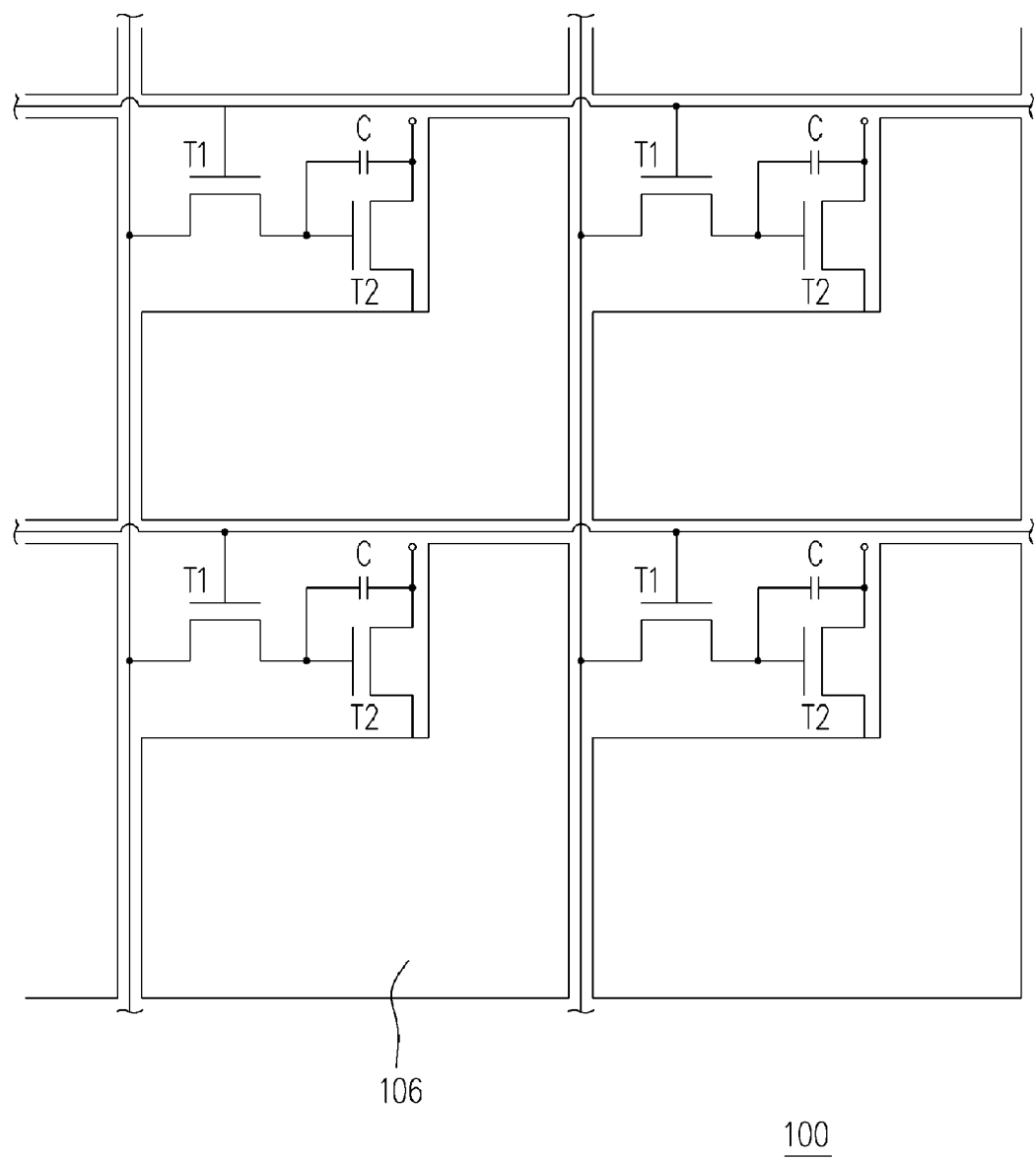
FIG. 1 is a circuit diagram illustrating part of a conventional active organic electroluminescent display.
Figure 2:
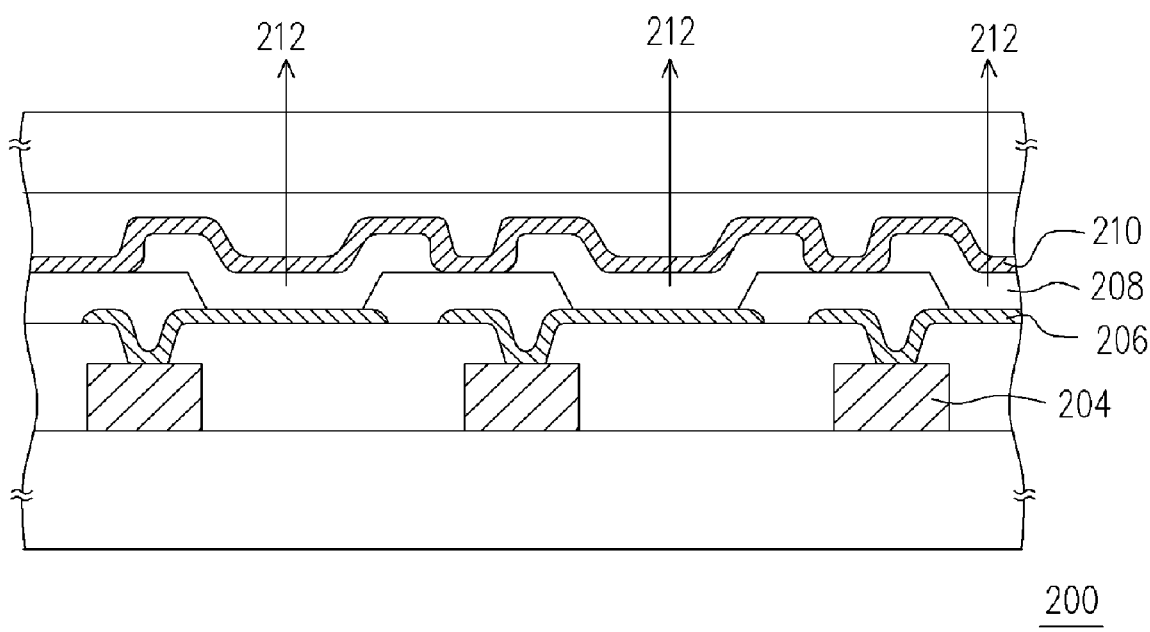
FIG. 2 is a profile view illustrating part of a conventional top emission active organic electroluminescent display.
Figure 3:
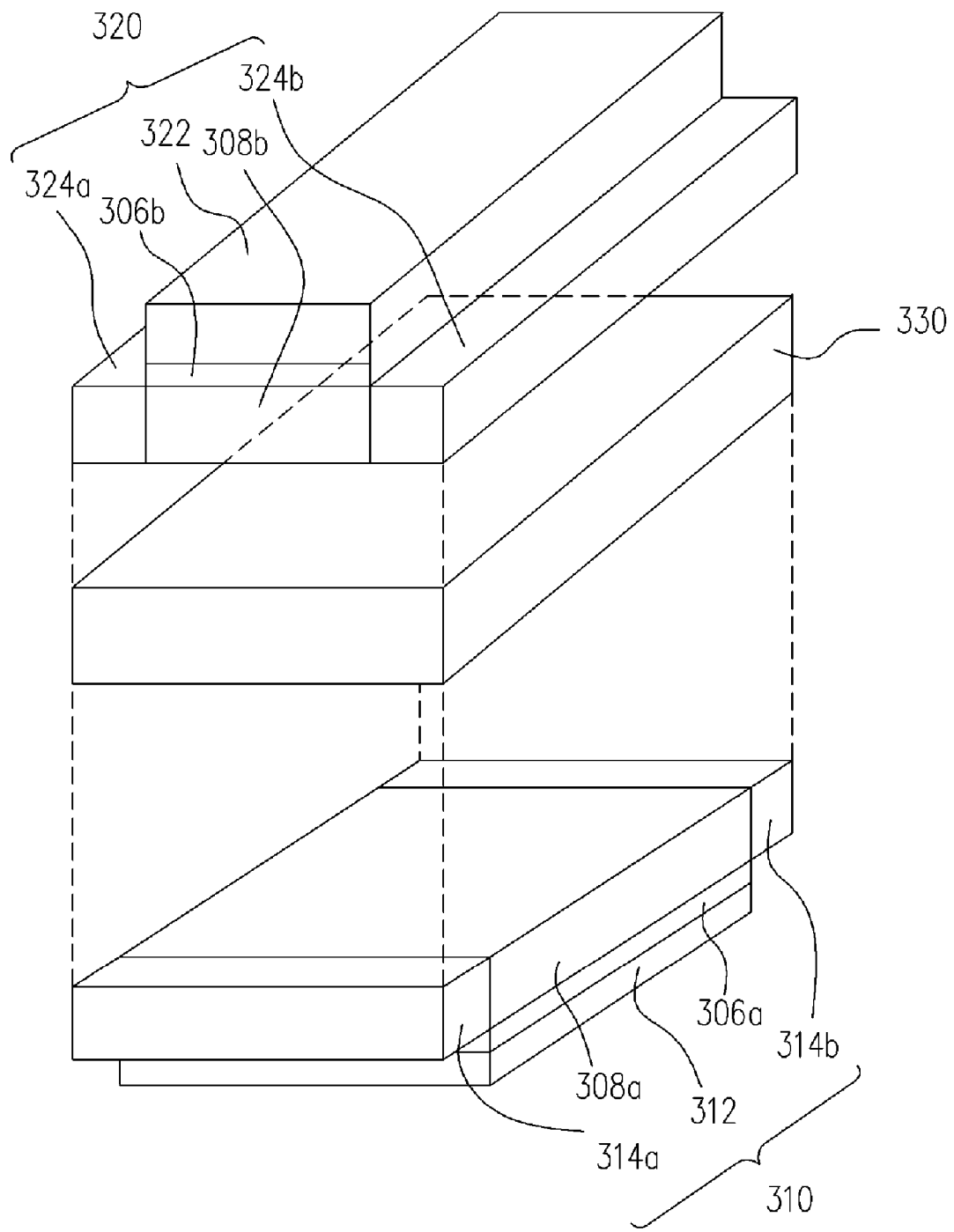
FIG. 3 is a stereogram of an organic electroluminescent device according to an exemplary embodiment of the present invention.

FIG. 3 is a stereogram of an organic electroluminescent device according to an exemplary embodiment of the present invention. Referring to FIG. 3, the organic electroluminescent device 300 includes a first organic thin film transistor 310, a second organic thin film transistor 320, and at least one organic functional layer 330. The first organic thin film transistor 310 has a first control terminal 312, a first input terminal 314a, a first output terminal 314b, and a first channel 308a located between the first input terminal 314a and the first output terminal 314b. A first insulating layer 306a is disposed between the first control terminal 312 and the first channel 308a, and the first channel 308a is located on the first insulating layer 306a.

The second organic thin film transistor 320 has a second control terminal 322, a second input terminal 314a, a second output terminal 324b, and a second channel 308b located between the second input terminal 324a and the second output terminal 324b, and a second insulating layer 306b is disposed between the second control terminal 322 and the second channel 308b, and the second channel 308b is located under the second insulating layer 306b.

There is an included angle, which is 90 degree for example, between the projection of the first channel 308a of the first organic thin film transistor 310 and the projection of the second channel 308b of the second organic thin film transistor 320. In other words, the extension direction of the second input terminal 324a to the second output terminal 324b of the second organic thin film transistor 320 is perpendicular to the extension direction of the first input terminal 314a to the first output terminal 314b of the first organic thin film transistor 310.

Referring to FIG. 3 again, the materials of the first control terminal 312, the first input terminal 314a, and the first output terminal 314b of the first organic thin film transistor 310 and the second control terminal 322, the second input terminal 324a, and the second output terminal 324b of the second organic thin film transistor 320 are conductive materials or conductive metal oxides. The conductive materials include at least one of gold, aluminum, aluminum/lithium fluoride, calcium, magnesium, silver, copper, chromium, manganese, indium, tin and alloys thereof. The alloys containing magnesium, for example, are magnesium silver alloy, magnesium indium alloy, magnesium tin alloy, magnesium stibium alloy or magnesium tellurium alloy. The conductive metal oxides include at least one of indium tin oxide (ITO), aluminum zinc oxide (AZO), indium zinc oxide (IZO), and cadmium stannic oxide (CdSnO).

The organic functional layer 330 is disposed between the first organic thin film transistor 310 and the second organic thin film transistor 320. Additionally, in the present embodiment, the organic functional layer 330 is disposed between the first channel 308a and the second channel 308b, and the material of the organic functional layer 330 includes at least one of polymer organic material or small molecule organic material. The organic functional layer 330 in the present invention may be formed with organic material of single layer, double layers, three layers, or more layers. The number of layers of the organic functional layer 330 is not limited in the present invention and those who are skilled in the art may determine the number of layers of the organic functional layer 330 based on the actual device and process.

Referring to FIG. 3 again, the first organic thin film transistor 310 is a p-type or n-type organic thin film transistor. When the first organic thin film transistor 310 is a p-type organic thin film transistor, the second organic thin film transistor 320 is an n-type organic thin film transistor. The first channel 308a is formed with organic material, which allows the transmission of electric holes, and the second channel 308b is formed with organic material which allows the transmission of electrons. Accordingly, when electric holes are transmitted from the first input terminal 314a (source) to the first output terminal 314b (drain) through the first channel 308a, and electrons are transmitted from the second input terminal 324a (drain) to the second output terminal 324b (source) through the second channel 308b, the electric holes and the electrons will enter the organic functional layer 330 from the first channel 308a and the second channel 308b respectively, and then recombine in the organic functional layer 330 to emit light.

When the first organic thin film transistor 310 is an n-type organic thin film transistor, the second organic thin film transistor 320 is a p-type organic thin film transistor. The principle of emission mechanism of the organic electroluminescent device 300 is similar to the above; therefore, further explanations are omitted.

The first organic thin film transistor 310 and the second organic thin film transistor 320 of the organic electroluminescent device in the present invention may have different structure in other embodiments, which will be described with reference to embodiments. FIG. 4 is a profile view of the first organic thin film transistor 310 and the organic functional layer 330 in FIG. 3. FIG. 4B to 4C are profile views illustrating the first organic thin film transistor 310 and the organic functional layer 330 according to other embodiments of the present invention, respectively.

Figure 4A:
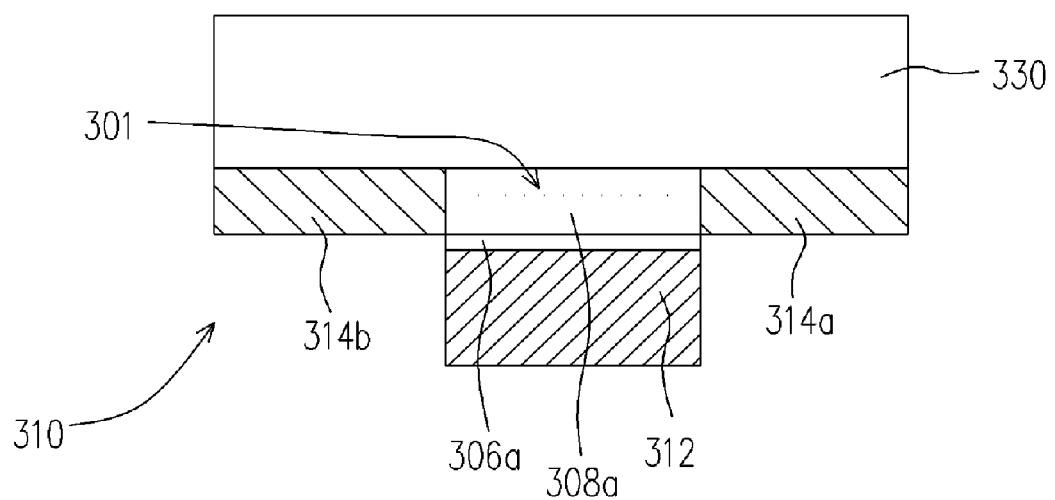
FIG. 4A to 4C are profile views illustrating the first organic thin film transistor and the organic functional layer of the organic electroluminescent device, respectively, according to an exemplary embodiment of the present invention.
Figure 4B:
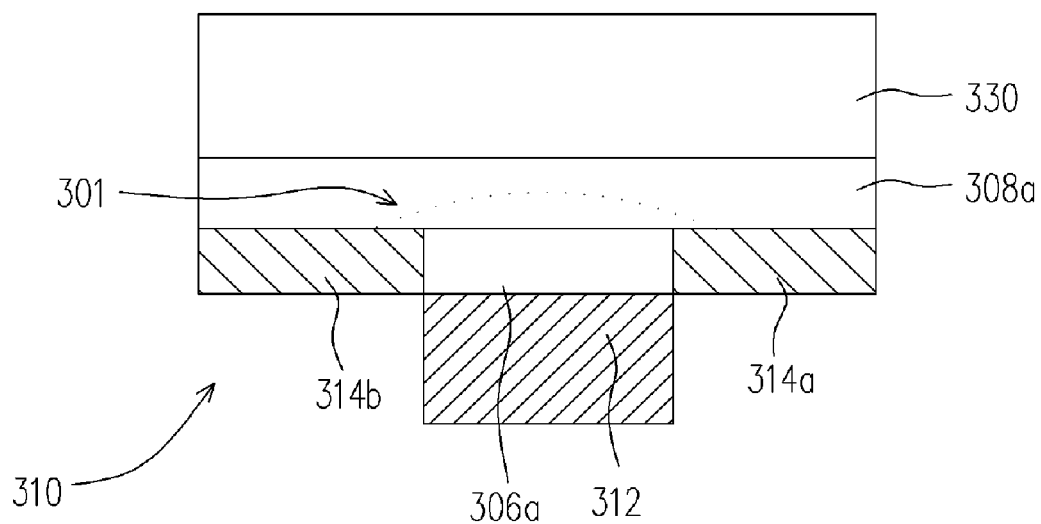
Figure 4C:
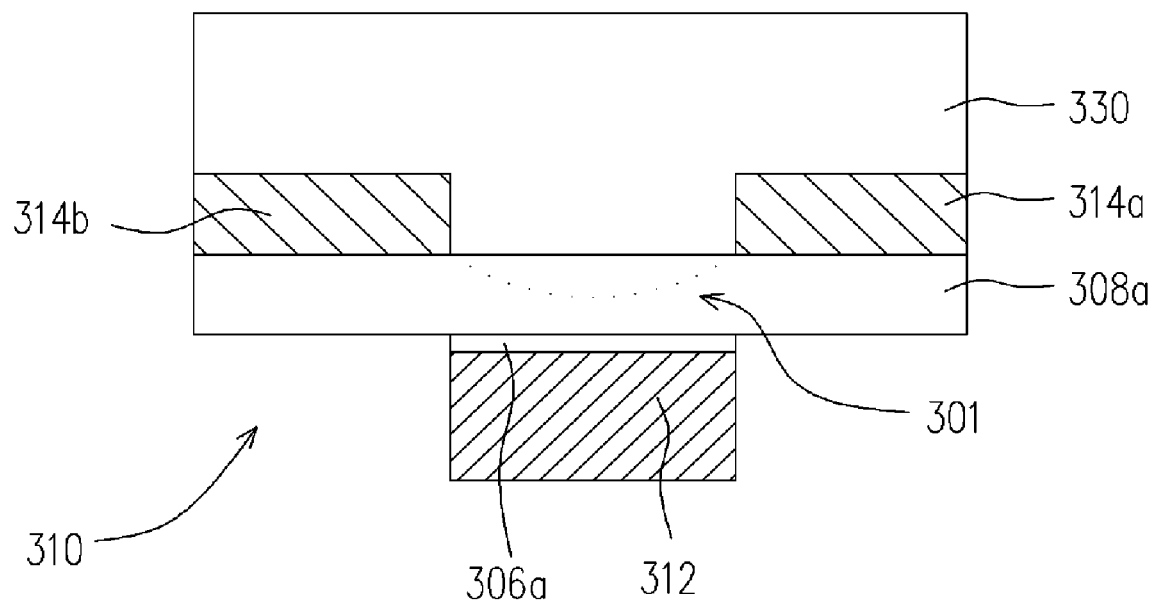

Referring to FIG. 4A first, in the first organic thin film transistor 310 of the present embodiment, the carriers (electric holes or electrons) 301 are transmitted from the first input terminal 314a to the first output terminal 314b through the first channel 308a. Referring to FIG. 4B, in other embodiments, the following step is the first insulating layer 306a located between the first input terminal 314a and the first output terminal 314b, and the first channel 308a is located on the first insulating layer 306a. The carriers 301 are transmitted from the first input terminal 314a to the first output terminal 314b through the over first channel 308a.

Referring to FIG. 4C, the organic functional layer 330 is disposed between the first input terminal 314a and the first output terminal 314b of the first organic thin film transistor 310. The carriers (electric holes or electrons) 301 are transmitted from the first input terminal 314a to the first output terminal 314b through the under first channel 308a.

The structure of the second organic thin film transistor 320 of the present invention may be changed like the one of the first organic thin film transistor 310 described above, and may be combined with any one of the first organic thin film transistor 310s described above into the organic electroluminescent device of the present invention. Since the present invention is not intended to limit the pattern of the first organic thin film transistor and the second organic thin film transistor, those who are skilled in the art may choose the pattern according to the present invention.

FIG. 3 illustrates the organic electroluminescent device as an example to explain the emission mechanism of the organic electroluminescent device of the present invention, in which the first organic thin film transistor 310 is a p-type organic thin film transistor and the second organic thin film transistor 320 is an n-type organic thin film transistor, without limitation to the conductivity type of the first organic thin film transistor 310 and the second organic thin film transistor 320 of the present invention. It can be understood by those skilled in the art that the first organic thin film transistor 310 can be changed into an n-type organic thin film transistor, and the second organic thin film transistor 320 can be changed into a p-type organic thin film transistor.

Referring to FIG. 3 again, if the voltage applied to the first control terminal 312 of the first organic thin film transistor 310 is greater than the threshold voltage of the first organic thin film transistor 310, and the voltage applied to the second control terminal 322 of the second organic thin film transistor 320 is greater than the threshold voltage of the second organic thin film transistor 320, the electric holes move in the first channel 308a between the first input terminal 314a and the first output terminal 314b, while the electrons will move in the second channel 308b between the second input terminal 324a and the second output terminal 324b. Besides, the electric holes and the electrons move towards the organic functional layer 330 due to the voltage difference between the first control terminal 312 and the second control terminal 322 and recombine in the organic functional layer 330 to emit light from the organic functional layer 330. The materials of the first control terminal 312, the first input terminal 314a, and the first output terminal 314b of the first organic thin film transistor 310, and the second control terminal 322, the second input terminal 324a, and the second output terminal 324b of the second organic thin film transistor 320 are conductive metal oxides. The light emitted by the organic functional layer 330 is emitted from any direction of the organic electroluminescent device 300; therefore, the organic electroluminescent device 300 has high emission efficiency.

The application of the organic electroluminescent device in active organic electroluminescent display panels will be explained below.

Figure 5:
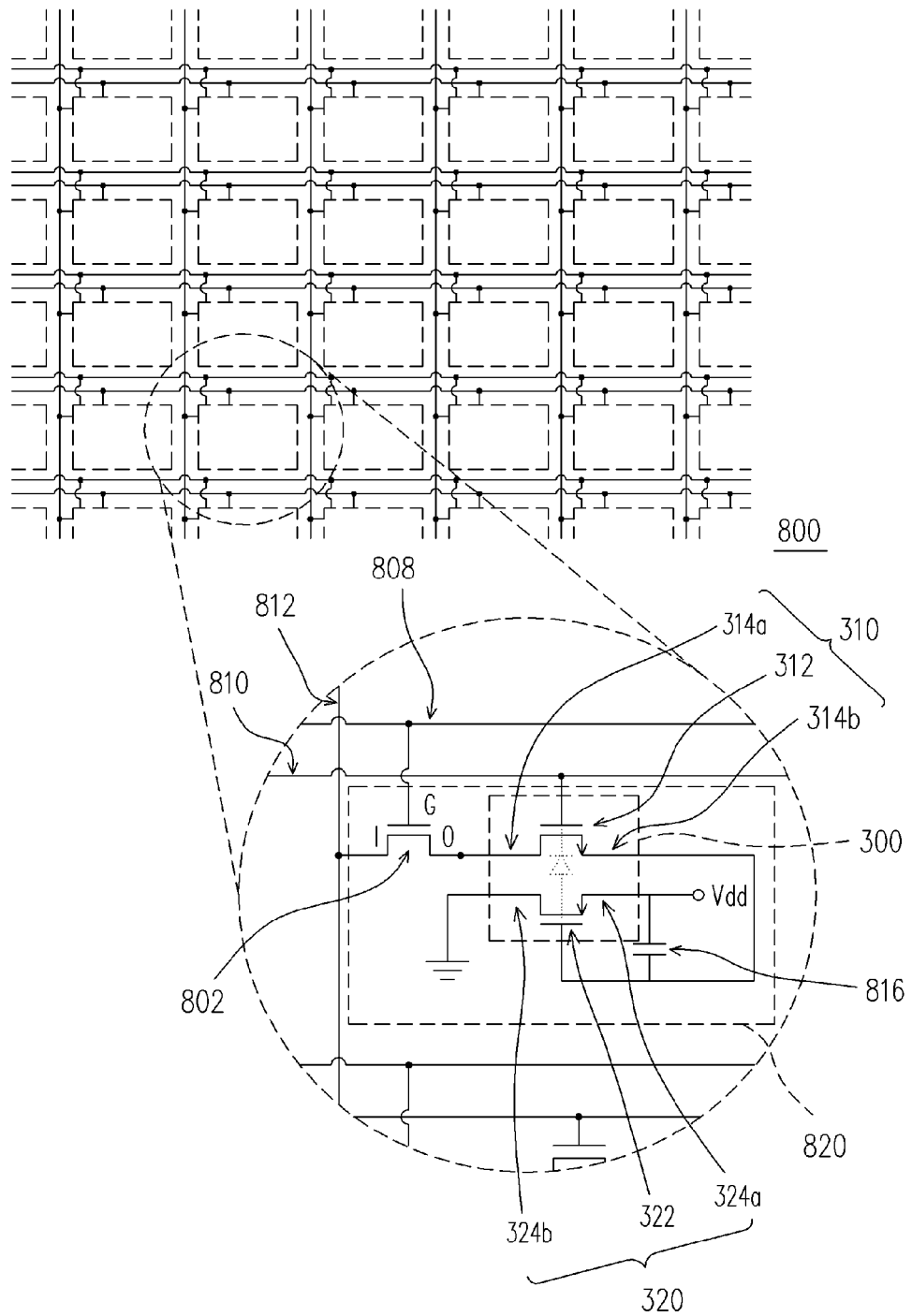
FIG. 5 is a circuit diagram of a pixel array of an organic electroluminescent device according to an exemplary embodiment of the present invention.

FIG. 5 is a circuit diagram of a pixel array of an organic electroluminescent device according to an exemplary embodiment of the present invention. Referring to FIG. 5, the pixel array 800 of the organic electroluminescent device is formed by the pixel structure 820 of the organic electroluminescent device, a first scan line 808, a second scan line 810, and a data line 812.

As described above, the pixel structure 820 of the organic electroluminescent device includes an organic electroluminescent device 300, an actuator 802, and a charge storage device 816. The organic electroluminescent device 300 includes a first organic thin film transistor 310, a second organic thin film transistor 320, and at least one organic functional layer 330 (refer to FIG. 3). The second control terminal 322 of the second organic thin film transistor 320 is connected to the first output terminal 314b of the first organic thin film transistor 310, and the first control terminal 312 of the first organic thin film transistor 310 is connected to the second control terminal 322 of the second organic thin film transistor 320 through the organic functional layer 330.

The actuator 802 has a third input terminal I, a third output terminal O connected to the first input terminal 314a of the first organic thin film transistor 310, and a third control terminal G. In an exemplary embodiment, the actuator 802 includes at least a thin film transistor which may be n-type or p-type thin film transistor. The charge storage device 816 includes at least a capacitor connected to the first output terminal 314b of the first organic thin film transistor 310 and the second input terminal 324a of the second organic thin film transistor 320.

Referring to FIG. 5 again, the first scan line 808 is connected to the third control terminal G of the actuator 802, the data line 812 is connected to the third input terminal I of the actuator 802, and the second scan line 810 is connected to the first control terminal 312 of the first organic thin film transistor 310.

The driving method of the pixel array of the active organic electroluminescent device described above will be explained with reference to an embodiment. In the following embodiment, the actuator 802 and the first organic thin film transistor 310 are n-typed, and the second organic thin film transistor 320 is p-typed.

Figure 6:
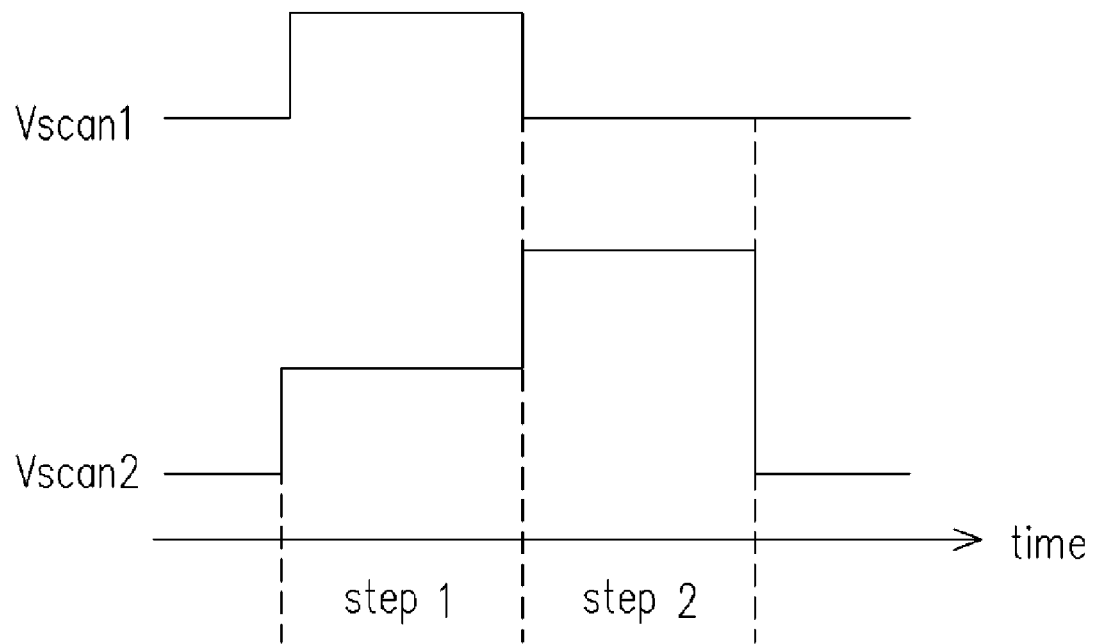
FIG. 6 is an oscillogram of the voltage signal inputted to the first scan line and the second scan line in FIG. 5.

FIG. 6 is an oscillogram of the voltage signal inputted to the first scan line and the second scan line in FIG. 5. Referring to both FIGS. 5 and 6, in step 1, the actuator 802 and the first organic thin film transistor 310 are turned on, and the second organic thin film transistor 320 is held in off status. The first input voltage signals through the first scan line 808 and the second scan line 810 are used, respectively, to turn on the actuator 802 and the first organic thin film transistor 310, and control the voltage level of the second control terminal 322 of the second organic thin film transistor 320 with the voltage signal inputted into the first organic thin film transistor 310 to keep the second organic thin film transistor 320 in the off status. In the following step, a data signal is transmitted from the data line 812 to the charge storage device 816 through the actuator 802 and the first organic thin film transistor 310, which are turned on, for data storage. In step 2, the actuator 802 is turned off, and the voltage value inputted by the second scan line 810 is changed to turn on the second organic thin film transistor 320. A voltage difference is therefore produced between the first control terminal 312 of the first organic thin film transistor 310 and the second control terminal 322 of the second organic thin film transistor 320, and the charge storage device 816 output the data signal stored therein. The carriers moveing from the first input terminal 314a to the first output terminal 314b in the first organic thin film transistor 310 and the carriers moveing from the second input terminal 324a to the second output terminal 324b in the second organic thin film transistor 320 also move towards the organic functional layer 330 between the first control terminal 312 of the first organic thin film transistor 310 and the second control terminal 322 of the second organic thin film transistor 320 (referring to FIG. 3) at the same time for the recombination in the organic functional layer 330, allowing the organic electroluminescent device 300 to emit light.

In conclusions, the present invention provides better process reliability and solves the problem of that the narrow aperture ratio of the conventional active organic electroluminescent device is limited by the size of thin film transistors by integrating the organic thin film transistors and the organic electroluminescent device. With the application of the present invention is to active organic electroluminescent devices, the aperture ratio and the resolution of the displays increase significantly since the size of pixel is exactly that of organic thin film transistors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic electroluminescent device, comprising:
   a first organic thin film transistor having a first control terminal, a first input terminal, a first output terminal, and a first channel located between the first input terminal and the first output terminal;
   a second organic thin film transistor having a second control terminal, a second input terminal, a second output terminal, and a second channel located between the second input terminal and the second output terminal; and
   at least an organic functional layer disposed between the second organic thin film transistor and the first organic thin film transistor and recombining electric holes from the first organic thin film transistor and electrons from the second organic thin film transistor;
   wherein the projection of the first channel is perpendicular to the projection of the second channel.

2. The organic electroluminescent device according to claim 1, wherein the organic functional layer is disposed between the first channel and the second channel.

3. The organic electroluminescent device according to claim 1, wherein the organic functional layer is disposed between the first input terminal and the first output terminal.

4. The organic electroluminescent device according to claim 1, wherein the organic functional layer is disposed between the second input terminal and the second output terminal.

5. The organic electroluminescent device according to claim 1, wherein the first organic thin film transistor is a p-type organic thin film transistor, and the second organic thin film transistor is an n-type organic thin film transistor.

6. The organic electroluminescent device according to claim 5, wherein the first input terminal is a source, the first output terminal is a drain, the second input terminal is a drain, and the second output terminal is a source.

7. The organic electroluminescent device according to claim 1, wherein the first organic thin film transistor is an n-type organic thin film transistor, and the second organic thin film transistor is a p-type organic thin film transistor.

8. The organic electroluminescent device according to claim 7, wherein the first input terminal is a drain, the first output terminal is a source, the second input terminal is a source, and the second output terminal is a drain.

9. The organic electroluminescent device according to claim 1, wherein the first channel is disposed on the first control terminal and the second channel is disposed under the second control terminal.

10. The organic electroluminescent device according to claim 9, further includes a first insulating layer disposed between the first control terminal and the first channel, and a second insulating layer disposed between the second control terminal and the second channel.

11. The organic electroluminescent device according to claim 10, wherein the first insulating layer is disposed between the first input terminal and the first output terminal, and the first channel is disposed on the first insulating layer.

12. The organic electroluminescent device according to claim 10, wherein the second insulating layer is disposed between the second input terminal and the second output terminal, and the second channel is disposed under the second insulating layer.

13. The organic electroluminescent device according to claim 10, wherein the first input terminal and the first output terminal are disposed in the organic functional layer.

14. The organic electroluminescent device according to claim 10, wherein the second input terminal and the second output terminal are disposed in the organic functional layer.

15. The organic electroluminescent device according to claim 1, wherein the material of the organic functional layer includes at least one of polymer organic material and small molecule organic material.

16. The organic electroluminescent device according to claim 1, wherein the materials of the first control terminal, the first input terminal, the first output terminal, the second control terminal, the second input terminal, and the second output terminal are conductive materials or conductive metal oxides.

17. The organic electroluminescent device according to claim 16, wherein the conductive materials include at least one of aluminum/lithium fluoride, aluminum, calcium, magnesium, indium, tin, manganese, chromium, copper, silver, gold, and alloys thereof.

18. The organic electroluminescent device according to claim 17, wherein the alloys containing magnesium are magnesium silver alloy, magnesium indium alloy, magnesium tin alloy, magnesium stibium alloy or magnesium tellurium alloy.

19. The organic electroluminescent device according to claim 16, wherein the conductive metal oxides include at least one of indium tin oxide (ITO), aluminum zinc oxide (AZO), indium zinc oxide (IZO), and cadmium stannic oxide (CdSnO).

* * * * *